(12) United States Patent
Logan et al.

(10) Patent No.: US 12,557,321 B2
(45) Date of Patent: Feb. 17, 2026

(54) RARE-EARTH III-NITRIDE N-POLAR HEMT

(71) Applicant: Raytheon Company, Waltham, MA (US)

(72) Inventors: John Andrew Logan, Lawrence, MA (US); Brian Douglas Schultz, Lexington, MA (US); Maher Bishara Tahhan, Tewksbury, MA (US)

(73) Assignee: RAYTHEON COMPANY, Arlington, VA (US)

( * ) Notice: Subject to any disclaimer, the term of this patent is extended or adjusted under 35 U.S.C. 154(b) by 367 days.

(21) Appl. No.: 17/666,671

(22) Filed: Feb. 8, 2022

(65) Prior Publication Data
US 2022/0262937 A1 Aug. 18, 2022

Related U.S. Application Data

(60) Provisional application No. 63/148,794, filed on Feb. 12, 2021.

(51) Int. Cl.
H10D 30/47 (2025.01)
H10D 62/85 (2025.01)

(52) U.S. Cl.
CPC ....... *H10D 30/472* (2025.01); *H10D 62/8503* (2025.01)

(58) Field of Classification Search
CPC ............. H01L 29/7781; H01L 29/2003; H01L 29/045; H01L 29/201; H10D 30/472; H10D 62/8503; H10D 62/852; H10D 62/405
See application file for complete search history.

(56) References Cited

U.S. PATENT DOCUMENTS

| 8,710,511 | B2 | 4/2014 | Gambin et al. |
| 10,109,728 | B2 | 10/2018 | Coffie |
| 10,283,597 | B2 | 5/2019 | Hardy et al. |
| 10,504,722 | B2 | 12/2019 | Snure et al. |
| 2002/0036287 | A1 | 3/2002 | Yu et al. |
| 2018/0138303 | A1* | 5/2018 | Coffie ..................... H01L 29/24 |
| 2019/0237570 | A1 | 8/2019 | Beam, III et al. |
| 2020/0052076 | A1 | 2/2020 | Ni et al. |
| 2020/0161417 | A1 | 5/2020 | Dargis et al. |

(Continued)

FOREIGN PATENT DOCUMENTS

| CN | 111785794 A | 10/2020 |
| JP | 2001077352 A | 3/2001 |
| JP | 2013030763 A | 2/2013 |

(Continued)

OTHER PUBLICATIONS

Frei Kathrin, "Epitaxial Growth of ScAlN Films for the Application as Novel Barrier Material in GaN-based HEMTs" https://d-nb.info/1206095733/34 (Year: 2019).*

(Continued)

*Primary Examiner* — Matthew L Reames
(74) *Attorney, Agent, or Firm* — Bachman & LaPointe, P.C.

(57) ABSTRACT

A high electron mobility transistor (HEMT) heterostructure includes a substrate; a N-polar channel layer; and a N-polar barrier layer positioned between the substrate and the channel layer, wherein the barrier layer comprises a rare-earth III-nitride material. The rare earth III-nitride material can be ScAlN.

15 Claims, 4 Drawing Sheets

(56) References Cited

U.S. PATENT DOCUMENTS

2020/0194312 A1  6/2020  Then et al.
2020/0388701 A1  12/2020  Hickman et al.

FOREIGN PATENT DOCUMENTS

JP     2019192795 A   10/2019
TW      202036899 A   10/2020

OTHER PUBLICATIONS

Taiwan Office Action dated Feb. 13, 2023 for corresponding application 111105015.
Man Hoi Wong et al: "Anomalous Output Conductance in N-Polar GaN High Electron Mobility Transistors", IEEE Transactions on Electron Devices, IEEE, USA, vol. 59, No. 11, Nov. 2012 (Nov. 2012), pp. 2988-2995, XP011471539, ISSN: 0018-9383, DOI: 10.1109/TED.2012.2211599.
Kazior Thomas E et al: "High Power Density ScAlN-Based Heterostructure FETs for mm-Wave Applications", 2019 IEEE MTT-S International Microwave Symposium (IMS), IEEE, Jun. 2, 2019 (Jun. 2, 2019), pp. 1136-1139, XP033579625.
International Search Report and Written Opinion dated Jun. 1, 2022 for PCT/US2022/015575.
Matthew T. Hardy et al., Epitaxial ScAlN grown by molecular beam epitaxy on GaN and SiC substrates, Applied Physics Letters 110, 162104, Apr. 20, 2017; https://doi.org/10.1063/1.4981807.
Matthew T. Hardy et al., Plasma-assisted Molecular Beam Epitaxy of N-polar InAlN-barrier High-electron-mobility Transistors, Journal of Visualized Experiments, Issue 117, Nov. 24, 2016, 117, e54775, pp. 1-8, http://www.jove.com/video/54775, doi:10.3791/54775.
S. Dasgupta Nidhi et al.,rap-related Delay analysis of self-aligned N-polar GaN/InAlN HEMTs with record extrinsic gm of 1105 mS/mm , 69th Device Research Conference, Santa Barbara, CA, 279-280, 2011, https://doi.org/10.1109/DRC.2011.5994531.
Andrew J. Green et al., ScAlN/GaN High-Electron-Mobility Transistors With 2.4-A/mm Current Density and 0.67-S/mm Transconductance, IEEE Electron Device Letters, vol. 40, No. 7, Jul. 2019, pp. 1056-1059.
Shubhra S. Pasayat et al., First demonstration of RF N-polar GaN MIS-HEMTs grown on bulk GaN using PAMBE, Semiconductor Science and Technology, 34, Mar. 11, 2019, 045009, pp. 1-5.
Masashi Suzuki et al., Polarity-inverted ScAlN film growth by ion beam irradiation and application to overtone acoustic wave (000-1)/(0001) film resonators, Applied Physics Letters 104, 172905, May 2, 2014,; https://doi.org/10.1063/1.4874840.
Japanese Office Action dated Dec. 17, 2024, issued in corresponding application JP2023-548611.
Kathrin Frei et al. , Investigation of growth parameters for ScAlN-barrier HEMT structures by plasma-assisted MBE, Japanese Journal of Applied Physics, Japan, The Japan Society of Applied Physics, 2019, vol. 58, SC1045.
EP Office Action dated Mar. 4, 2025, issued in corresponding application 22709446.3.
Office Action dated Dec. 12, 2024 issued in corresponding application KR 10-2023-7031024.
Japanese Office Action dated Jun. 24, 2025, issued in corresponding application JP2023-548611.

* cited by examiner

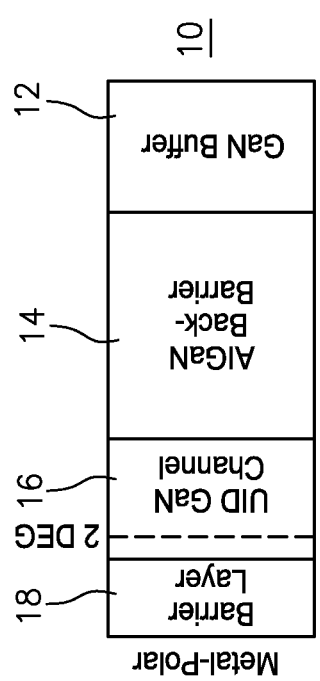
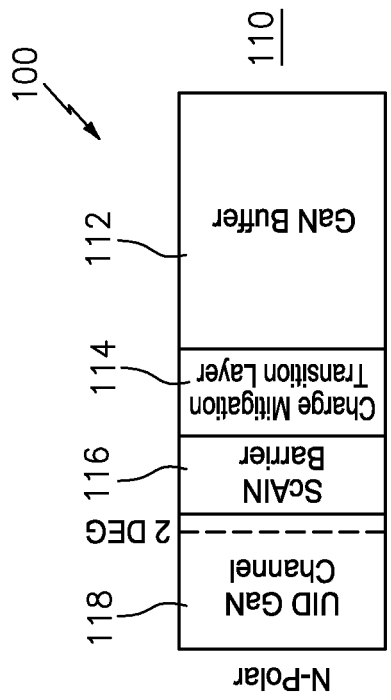
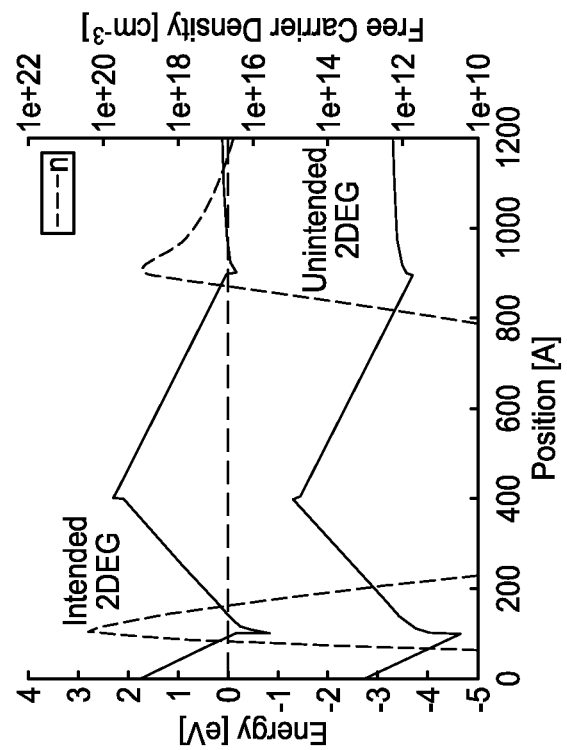
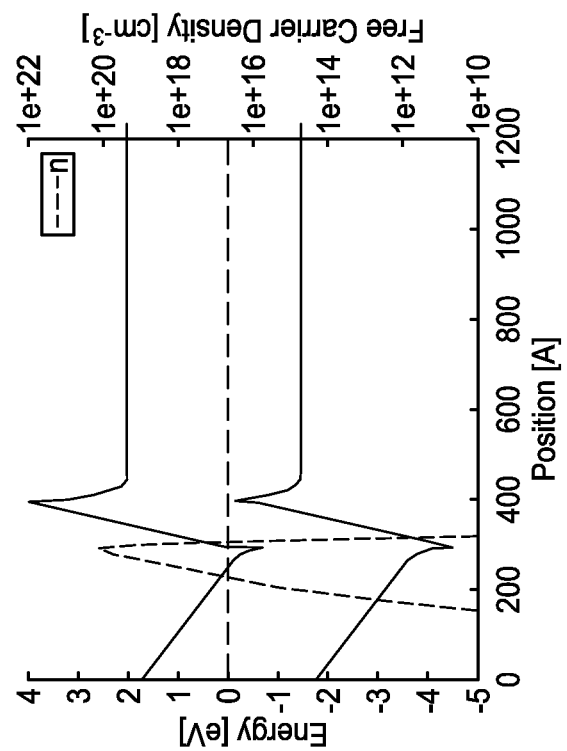

RARE-EARTH III-NITRIDE N-POLAR HEMT

BACKGROUND OF THE DISCLOSURE

The disclosure relates generally to high electron mobility transistors (HEMTs), and more particularly to a nitrogen-polar (N-polar) configuration of a HEMT including a rare-earth III-nitride barrier layer.

HEMT devices are semiconductor devices that have many applications, especially high frequency or high speed applications.

Many known III-nitride HEMT devices utilize a metal-polar orientation, which refers to the direction of the semiconductor crystal in the heterostructure. Metal-polar is the more standard approach for RF applications. In a metal-polar heterostructure, the metal-like atomic planes (such as gallium, aluminum, and/or indium) in the III-nitride material terminate the upper surface. FIGS. 1A and 1B illustrate metal-polar and N-polar configurations, respectively. While a metal-polar configuration has some advantages, there are also some limitations.

The materials for various layers in an HEMT heterostructure can greatly impact the performance of the device and one recently developed III-nitride material of interest, for use as a charge generation layer or barrier layer in an HEMT high-power transistor, is ScAlN. ScAlN has several advantages, compared to conventional materials like AlGaN, including a significantly higher intrinsic polarization and the ability to match the lattice parameter of GaN in the {0001} planes. However, challenges remain with respect to the use of this material in metal-polar HEMT devices, particularly with respect to leakage through the barrier and leakage out the backside of the channel into the buffer. The present disclosure is directed to these issues.

SUMMARY OF THE DISCLOSURE

In one non-limiting configuration, a high electron mobility transistor heterostructure, comprises a substrate; a N-polar channel layer; and a N-polar barrier layer positioned between the substrate and the channel layer, wherein the barrier layer comprises a rare-earth III-nitride material.

In a non-limiting configuration, the rare earth III-nitride material is selected from the group consisting of ScAlN, YAlN, LaAlN, PrAlN, GdAlN, ErAlN and combinations thereof.

In a further non-limiting configuration, the rare earth III-nitride material is selected from the group consisting of ScAlN, YAlN and combinations thereof.

In a still further non-limiting configuration, the heterostructure further comprises at least one of a nucleation layer, a buffer layer, and a charge mitigation transition layer between the substrate and the barrier layer.

In another non-limiting configuration, the heterostructure further comprises a nucleation layer between the substrate and the barrier layer.

In still another non-limiting configuration, the nucleation layer comprises an AlN nucleation layer.

In a further non-limiting configuration, the heterostructure further comprises a buffer layer between the nucleation layer and the barrier layer.

In a still further non-limiting configuration, the buffer layer comprises a GaN buffer layer.

In another non-limiting configuration, the heterostructure further comprises a charge mitigation transition layer between the buffer layer and the barrier layer.

In a further non-limiting configuration, the charge mitigation transition layer comprises a graded rare-earth III-nitride alloy layer.

In still another non-limiting configuration, the charge mitigation transition layer comprises a doped GaN layer.

In a further non-limiting configuration, the heterostructure further comprises at least one capping layer disposed opposite from the barrier layer relative to the channel layer.

In a still further non-limiting configuration, the at least one capping layer is selected from the group consisting of an etch stop layer, an interlayer, an upper barrier and combinations thereof.

In another non-limiting configuration, the channel layer comprises a GaN channel layer.

In still another non-limiting configuration, the rare-earth III-nitride material of the barrier layer is in the N-polar orientation.

In another non-limiting configuration, the channel layer is in the N-polar orientation.

BRIEF DESCRIPTION OF THE DRAWINGS

A detailed description of one or more embodiments of the disclosure follows, with reference to the attached drawings, wherein:

FIGS. 3 and 3A illustrate a prior-art metal-polar HEMT heterostructure configuration with an additional AlGaN back-barrier layer;

FIGS. 4 and 4A illustrate a N-polar HEMT heterostructure configuration in accordance with the present disclosure.

Like reference numbers and designations in the various drawings indicate like elements.

DETAILED DESCRIPTION

The present disclosure relates to a N-polar configuration of a HEMT heterostructure which utilizes a rare-earth III-nitride material for the charge generation layer. One particularly suitable non-limiting configuration utilizes ScAlN as the charge generation layer, which, in an N-polar orientation, helps to provide all the benefits of using ScAlN as the material for the charge generation layer, while resolving the issue of leakage as mentioned above.

Figure 2:
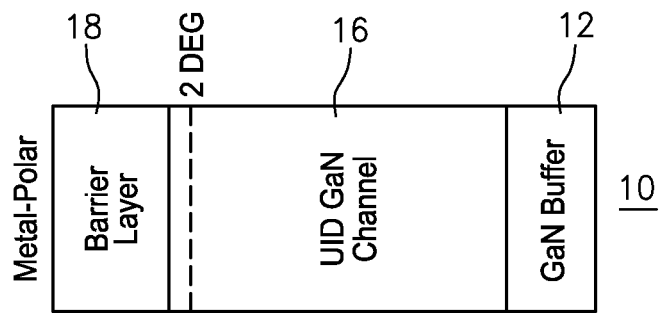
FIGS. 2 and 2A illustrate a prior-art metal-polar HEMT heterostructure configuration.
Figure 2A:
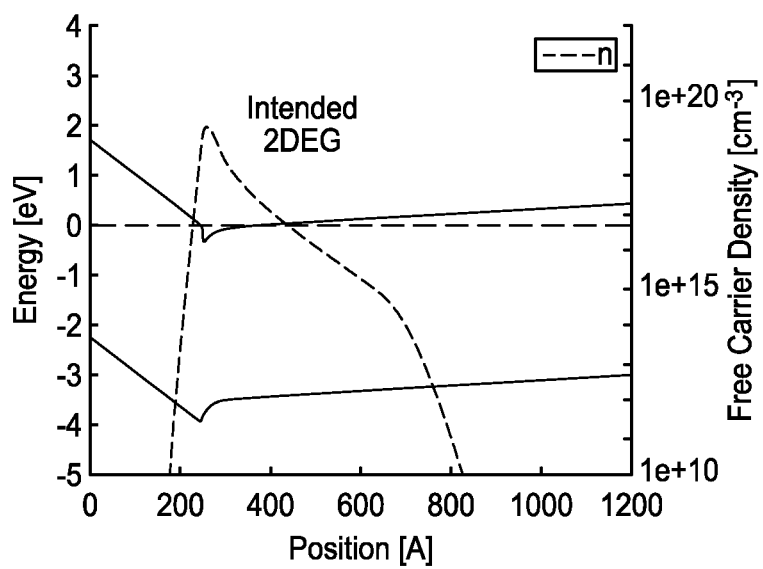

FIGS. 2 and 2A show a typical arrangement of a metal-polar HEMT heterostructure. FIG. 2 shows substrate 10 having a GaN buffer layer 12 deposited thereon. A channel layer 16, such as an unintentionally doped (UID) GaN channel layer, can be deposited on buffer layer 12. Finally, as schematically illustrated in FIG. 2, a barrier layer 18 can be deposited on channel layer 16. Barrier layer 18 can be fabricated from various III-nitride materials (IIIA and IIIB, for example: AlGaN, InAlN, ScAlN). In this configuration, as set forth above, for barrier layers which result in a very high two-dimensional electron gas (2DEG) charge density (above ~1E13 $cm^{-2}$) unintended leakage pathways from the 2DEG into the buffer may become increasingly problematic due to insufficient carrier confinement. In addition, the high electric field induced between the 2DEG and the surface may lead to earlier breakdown.

FIGS. 3 and 3A show an alternative arrangement of a metal-polar HEMT heterostructure. FIG. 3 shows substrate 10 having a GaN buffer layer 12 deposited thereon. An AlGaN back barrier layer 14 can typically be deposited upon buffer layer 12. A channel layer 16, such as an UID GaN channel layer, can be deposited on back barrier 14. Finally, as schematically illustrated in FIG. 3, a barrier layer 18 can be deposited on channel layer 16. Barrier layer 18 can be fabricated from various group III-nitride materials (IIIA and IIIB, for example: AlGaN, InAlN, ScAlN). In this configuration, as set forth above, leakage may be encountered due to an unintended additional 2DEG that may be established near the interface between the buffer layer 12 and the back barrier layer 14, as shown in FIG. 3A.

Figures 1A, 1B:
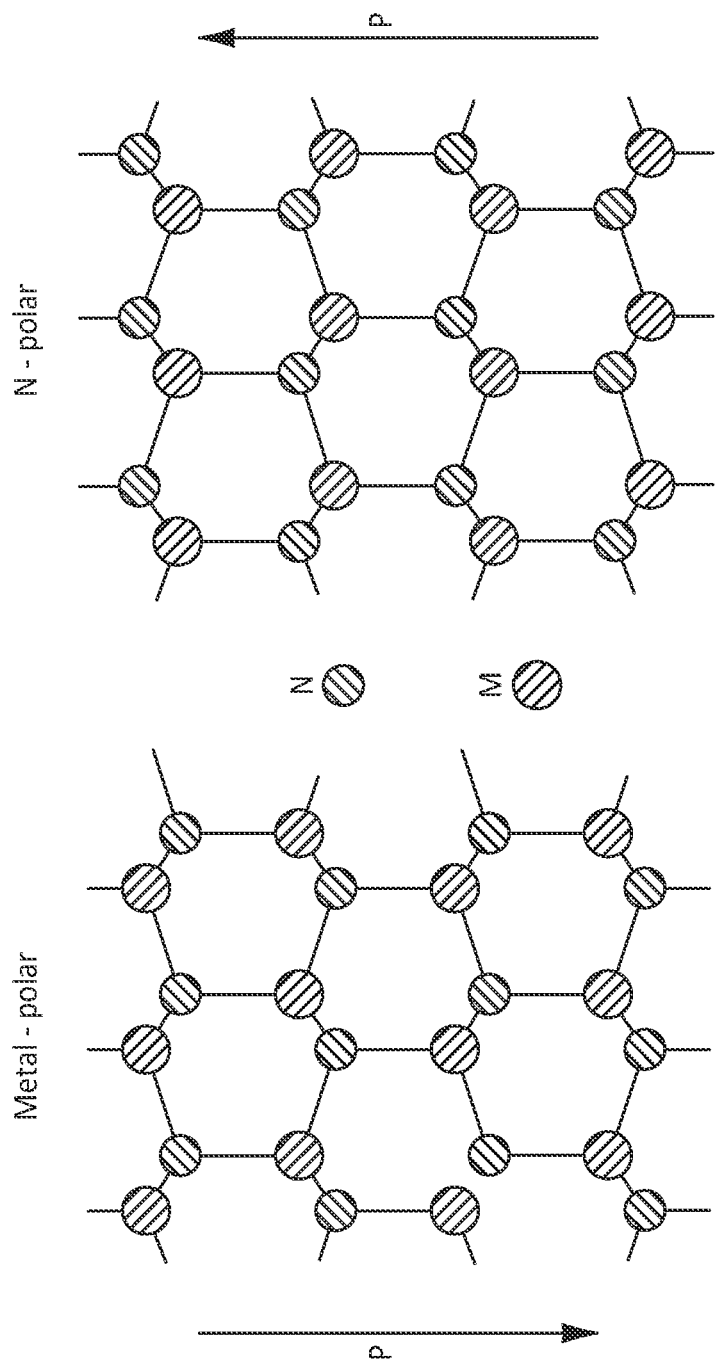
FIGS. 1A and 1B illustrate III-nitride metal-polar and N-polar crystal orientation diagrams.

FIGS. 4 and 4A illustrate one non-limiting configuration of a N-polar heterostructure 100 which has a substrate 110, a GaN buffer layer 112, a charge mitigation transition layer 114, a rare-earth III-nitride (IIIA, IIIB, Lanthanides, for example: ScAlN, YAlN and the like) barrier layer 116 followed by channel layer 118. In this configuration, which is referred to as an N-polar configuration, the crystal orientation of the heterostructure profile layers is such that the nitrogen atomic planes terminate the upper surface of the material heterostructure, for example as illustrated in FIG. 1B.

In one configuration, the charge mitigation transition layer 114 may, for example, be a graded rare-earth III-nitride alloy and/or heavily-doped GaN. The intent of this transition layer is to manipulate the electronic structure of the resulting heterostructure so as to prevent the formation of an unintentional 2D electron gas or 2D hole gas near the lower interface of the barrier layer 116. As such, for the heavily-doped GaN example, suitable dopants include silicon, carbon, iron, beryllium, magnesium and the like (as are known in the art to cause band bending and/or Fermi level pinning in GaN) depending on the particular buffer structure. Due to the N-polar crystal orientation of the barrier 116 and channel 118, more aggressive approaches with the transition layer may be utilized to prevent unintended 2D gas formation due to the fact that, unlike in a metal-polar configuration, the intended 2DEG sits on the opposite side of the barrier layer.

It has been found that this orientation and configuration can significantly reduce, and thereby address, the leakage encountered with the configuration of FIGS. 2 and 3. Both N-polar and metal-polar orientations use a pair of layers to form the 2DEG, more specifically a GaN channel layer and a charge generation layer. For metal-polar HEMTs, the charge generation layer is closer to the surface, while in N-polar HEMTs, the GaN channel layer is closer to the surface. Due to its larger electron affinity, the GaN channel layer provides a lower barrier to prevent electron leakage. In the metal-polar configuration of FIGS. 2, 2A, the GaN channel layer resides on the same side of the barrier as the buffer layer, allowing leakage into the buffer unless a back barrier is added between the channel and buffer. Further, in the metal-polar configuration of FIGS. 3, 3A, commonly used back barrier materials are the same as the charge generation layer materials. As a result, the introduction of a back barrier layer can easily induce an additional unintended 2DEG (as shown in FIG. 3A) near the interface of the back barrier and buffer. If present, this unintended 2DEG acts as a leakage path, degrading device performance in the metal-polar configuration. Conversely, in the N-polar orientation (FIGS. 4, 4A), the charge generation layer acts as an enhanced leakage barrier towards the buffer as it resides between the intended 2DEG and the buffer.

The combination of layers and crystal orientation in these different configurations cause an energy well to form that will trap the electrons into a 2D sheet. This 2DEG is present in both metal-polar and N-polar configurations. As indicated above, the GaN channel side of the energy well has a shorter energy barrier and may allow some electrons to escape into adjacent layers in that direction.

For the metal-polar configuration, the GaN channel side of the energy well is towards the buffer and substrate. To reduce this leakage, a back-barrier can be added, but unfortunately the most convenient barrier to add is the same material that creates an energy well, which can create a second energy well that traps electrons, which is undesired.

For N-polar, conversely, the GaN channel side of the energy well is towards the surface. Consequently, adding an electron barrier on top of the GaN channel does not require any further GaN layer on top of that new barrier. Thus, no additional pair of materials where GaN is above the barrier is present. Thus no additional channel is formed when attempting to reduce leakage by adding barriers to the electron leakage. Additionally there is less need to add a specific barrier layer since the electric field in the GaN layer, as long as it remains below a certain thickness, can keep the electrons contained within the well.

The heterostructure as illustrated in FIG. 4 has at least channel layer 118 and barrier layer 116 which are N-polar. In the simplest situation, the entire heterostructure has N-polar structure, as this is carried over during generation of the various layers of the heterostructure. However, it is not required that every layer be N-polar, and it is envisioned that under some circumstances it would be desirable to have one or more layers between substrate 110 and barrier layer 116 which may not be N-polar.

FIGS. 2A, 3A, and 4A, which are aligned with FIGS. 2, 3, and 4, show 1D Schrödinger-Poisson band-structure simulations for each of the aligned heterostructures along with the calculated free carrier charge density distribution. These figures highlight the advantageous band structure produced with the heterostructure as disclosed herein (FIG. 4A).

FIGS. 5-8 illustrate different non-limiting configurations of the N-polar heterostructure according to this disclosure.

It will become apparent that each of these different configurations has different layers. These layers, as is well known in the industry, are generally grown from the substrate up using epitaxial fabrication processes that deposit or grow various semiconductor layers on a crystalline substrate to produce the desired material heterostructure. This heterostructure then goes through subsequent processing steps such as lithography and/or etching to result in a device. Such a device will typically include a gate and ohmic contacts as well as other layers or components all as are well known to a person having ordinary skill in the art.

Figures 5, 6, 7, 8:
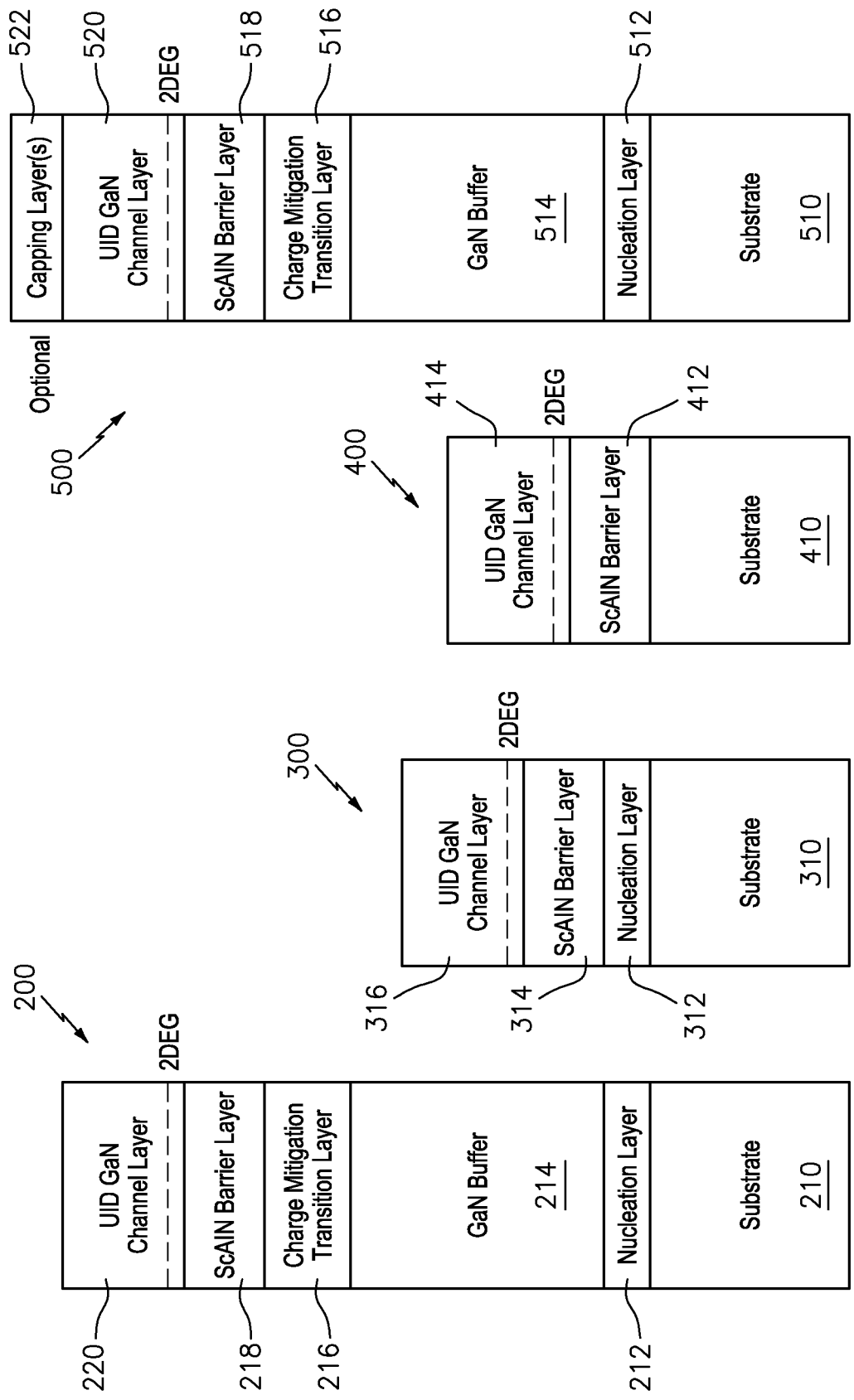
FIGS. 5-8 illustrate different non-limiting embodiments of heterostructure configurations as disclosed herein.

Referring to the configuration of FIG. 5, a heterostructure 200 is schematically illustrated having a substrate 210. A nucleation layer 212 such as an AlN nucleation layer can be formed on the substrate 210. Following nucleation layer 212, a buffer layer such as a GaN buffer 214 can be grown onto nucleation layer 212. An optional charge mitigation transition layer 216 can then be grown onto buffer layer 214.

Following this layer, a N-polar barrier (charge generating) layer 218, can be deposited onto transition layer 216, followed by a N-polar UID GaN channel layer 220.

In particular, the N-polar configuration can advantageously be utilized in combination with the rare-earth III-nitride barrier layer 218 (such as ScAlN, YAlN, and the like). Such a configuration provides all the desired advantages of the ScAlN material, while significantly reducing the problems of leakage as encountered with FIGS. 2 and 3.

Suitable materials for the rare-earth III-nitride material include ScAlN, YAlN, LaAlN, PrAlN, GdAlN, ErAlN and combinations thereof. Particularly useful rare-earth III-nitride materials are ScAlN, YAlN and combinations thereof.

In the configuration as shown in FIGS. 4-8, enhanced charge confinement becomes substantially easier to incorporate into the heterostructure as the addition of additional buried layers in heterostructure (as would be required in the metal-polar configuration such as FIG. 2 or 3) is no longer required. Instead, optional capping layers can be added to the surface (such as in FIG. 8). Thus, the N-polar orientation provides substantial benefits as compared to the metal-polar configuration for HEMT heterostructures with very high 2DEG charge density.

A further advantage of the configurations shown in FIGS. 4-8 is the ScAlN (or other rare-earth III-nitride material) barrier layer is no longer exposed to air and instead is positioned within the heterostructure. This helps prevent the incidental processing or surface degradation of the ScAlN charge generation layer.

Further, ohmic contacts are able to be made without passing through the barrier layer which could otherwise disturb the 2DEG formed by the contact between the channel layer and the barrier layer.

FIG. 6 shows a simplified non-limiting configuration wherein a device 300 has substrate 310, a nucleation layer 312, a ScAlN barrier layer 314 and channel layer 316. In this configuration, the buffer and transition layers of FIG. 5 are avoided. Nevertheless, device 300 as shown in FIG. 6 still produces desirable affects from utilizing the ScAlN barrier layer as disclosed herein.

FIG. 7 illustrates a further non-limiting configuration which is even more basic than the configurations of FIG. 6. In this configuration, device 400 has substrate 410 with barrier layer 412 deposited directly thereon, and channel layer 414 deposited directly on barrier layer 412.

Finally, FIG. 8 illustrates a still further non-limiting configuration wherein device 500 has substrate 510 with a nucleation layer 512, GaN buffer layer 514, charge mitigation transition layer 516, ScAlN barrier layer 518, UID GaN channel layer 520 and, optionally, one or more capping layers 522.

In this configuration, the capping layers can be an etch stop layer, an interlayer, an upper barrier layer, or one or more of these layers in combination. These capping layers can be used in any of the other configurations as well, as illustrated in FIGS. 6 and 7, as non-limiting examples.

The substrate of the various configurations disclosed herein can be any substrate suitable for the purposes discussed herein, such as SiC, sapphire, GaN, AlN, Si, etc. Because the various heterostructures disclosed herein are N-polar orientated, the orientation of the substrate must be consistent with the subsequent growth approach used to form the nucleation and/or buffer layers (if present) such that the charge generation layer and UID channel layer form with the top surface having a N-polar orientation.

It should also be appreciated that only the barrier layer and channel layer need to be N-polar. Other layers can have different configurations. While it would be most typical for the entire heterostructure to be N-polar oriented, alternate strategies are known in the art to control or flip III-nitride crystal polarization. In the most typical approach, the first grown layer (such as a nucleation layer) is grown in a manner as to ensure the surface has an N-polar polarity which is then maintained for the remainder of the heterostructure. However, as long as, first, the buffer and/or nucleation layers below the barrier layer do not cause unintentional leakage pathways to form, and second, the buffer and/or nucleation layers may be used to successfully grow the subsequent N-polar barrier and channel layers, the buffer and/or nucleation layers may be any combination of crystal orientation.

It is particularly effective for the respective layers to be grown such that each layer provides a base layer for proper epitaxial growth of the next layer. In some instances, a nucleation layer may be useful in transitioning from one material to the next, for example from substrate to buffer or barrier layers. In addition, charge mitigation transition and/or charge mitigation buffer layers can be useful when positioned between specific layers as well. Further, it should be understood that a single thin N-polar interlayer (such as AlN) or multiple thin N-polar interlayers (such as GaN and AlN) may be incorporated between the barrier layer and channel layer, as is known in the art.

It should be appreciated that the use of ScAlN as the barrier material provides a 2-3 times increase in charge density as compared to standard AlGaN HEMTs which results in a much greater benefit due to enhanced charge confinement. Further, flipping the material polarization to N-polar, as disclosed herein, produces significantly more freedom to design material structures that provide the enhanced charge confinement as set forth above, to numerous different configurations that will be apparent to a person having ordinary skill in the art when considering this disclosure.

It should also be appreciated that while the present disclosure is made in terms of a heterostructure, this heterostructure could itself be a component of a device having well known components such as a gate and/or ohmic contacts, in order to function as a transistor.

Various features that are shown and described in one figure or embodiment can be combined with other features that are shown and described in other figures and embodiments without limitation, and all such combinations are considered disclosed herein.

One or more embodiments of the present disclosure have been described. Nevertheless, it will be understood that various modifications may be made without departing from the spirit and scope of the invention. For example, different materials and configurations could be utilized, and transistor structures having different shapes or configurations may benefit from this disclosure. Accordingly, other embodiments are within the scope of the following claims.

What is claimed is:

1. A heterostructure, comprising:
   a substrate;
   a N-polar channel layer; and
   a N-polar barrier layer positioned between the substrate and the channel layer, wherein the barrier layer comprises a rare-earth III-nitride material, and wherein the rare-earth III-nitride material is in an N-polar orientation.

2. The heterostructure of claim 1, wherein the rare earth III-nitride material is selected from the group consisting of ScAlN, YAlN, LaAlN, PrAlN, GdAlN, ErAlN and combinations thereof.

3. The heterostructure of claim 1, wherein the rare earth III-nitride material is selected from the group consisting of ScAlN, YAlN and combinations thereof.

4. The heterostructure of claim 1, further comprising at least one of a nucleation layer, a buffer layer, and a charge mitigation transition layer between the substrate and the barrier layer.

5. The heterostructure of claim 1, further comprising a nucleation layer between the substrate and the barrier layer.

6. The heterostructure of claim 5, wherein the nucleation layer comprises an AlN nucleation layer.

7. The heterostructure of claim 5, further comprising a buffer layer between the nucleation layer and the barrier layer.

8. The heterostructure of claim 7, wherein the buffer layer comprises a GaN buffer layer.

9. The heterostructure of claim 7, further comprising a charge mitigation transition layer between the buffer layer and the barrier layer.

10. The heterostructure of claim 9, wherein the charge mitigation transition layer comprises a compositionally graded rare-earth III-nitride alloy layer.

11. The heterostructure of claim 9, wherein the charge mitigation transition layer comprises a doped GaN layer.

12. The heterostructure of claim 1, further comprising at least one capping layer disposed opposite from the barrier layer relative to the channel layer.

13. The heterostructure of claim 12, wherein the at least one capping layer is selected from the group consisting of an etch stop layer, an interlayer, an upper barrier and combinations thereof.

14. The heterostructure of claim 1, wherein the channel layer comprises a GaN channel layer.

15. The heterostructure of claim 7, wherein the buffer layer is in an N-polar orientation.

\* \* \* \* \*